US011749697B2

(12) United States Patent
Matsubara

(10) Patent No.: US 11,749,697 B2
(45) Date of Patent: Sep. 5, 2023

(54) IMAGE CAPTURING DEVICE UNIT INCLUDING MULTILAYER SUBSTRATE, MULTILAYER SUBSTRATE, AND IMAGE CAPTURING APPARATUS

(71) Applicant: CANON KABUSHIKI KAISHA, Tokyo (JP)

(72) Inventor: Kosuke Matsubara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 230 days.

(21) Appl. No.: 17/193,224

(22) Filed: Mar. 5, 2021

(65) Prior Publication Data

US 2021/0288089 A1 Sep. 16, 2021

(30) Foreign Application Priority Data

Mar. 11, 2020 (JP) ................. 2020-041717

(51) Int. Cl.
*H01L 27/146* (2006.01)
*H04N 23/52* (2023.01)
*H04N 23/54* (2023.01)

(52) U.S. Cl.
CPC .. *H01L 27/14618* (2013.01); *H01L 27/14636* (2013.01); *H04N 23/52* (2023.01); *H04N 23/54* (2023.01)

(58) Field of Classification Search
CPC ........ H01L 27/14618; H01L 27/14636; H04N 5/22521; H04N 5/2253; H04N 23/52; H04N 23/54
See application file for complete search history.

(56) References Cited

U.S. PATENT DOCUMENTS

2014/0339668 A1* 11/2014 Arima ................. H01L 23/4006
257/443
2016/0307954 A1* 10/2016 Arima .................. H04N 5/3698

FOREIGN PATENT DOCUMENTS

JP 2015012211 A 1/2015

* cited by examiner

*Primary Examiner* — Jonathan Han
(74) *Attorney, Agent, or Firm* — ROSSI, KIMMS & McDOWELL LLP

(57) ABSTRACT

An image capturing device unit includes a multilayer substrate, an image capturing device mounted on one face of the multilayer substrate, and components mounted on the other face of the multilayer substrate. The multilayer substrate includes electrodes to electrically connect the image capturing device and the multilayer substrate, vias that electrically connect the electrodes and the components, first wiring electrically connected to the vias, second wiring on layers of the multilayer substrate, and a non-wired region that insulates the vias and the first wiring from the second wiring on each of the layers. The vias are located in the multilayer substrate so that, on a projection plane given when the multilayer substrate is viewed in a layering direction of the multilayer substrate, there is no area in which the non-wired region overlaps with a region where the image capturing device is arranged throughout the layers.

9 Claims, 8 Drawing Sheets

IMAGE-CAPTURING-DEVICE-SIDE
CONDUCTOR LAYER 324

IMAGE-CAPTURING-DEVICE-SIDE
CONDUCTOR LAYERS 323 AND 322

IMAGE-CAPTURING-DEVICE-SIDE
CONDUCTOR LAYER 321

COMPONENT-SIDE CONDUCTOR
LAYER 321

COMPONENT-SIDE CONDUCTOR
LAYERS 322 AND 323

COMPONENT-SIDE CONDUCTOR
LAYER 324

IMAGE-CAPTURING-DEVICE-SIDE
CONDUCTOR LAYER 324

IMAGE-CAPTURING-DEVICE-SIDE
CONDUCTOR LAYERS 323 AND 322

IMAGE-CAPTURING-DEVICE-SIDE
CONDUCTOR LAYER 321

COMPONENT-SIDE CONDUCTOR
LAYER 321

COMPONENT-SIDE CONDUCTOR
LAYERS 322 AND 323

COMPONENT-SIDE CONDUCTOR
LAYER 324

IMAGE-CAPTURING-DEVICE-SIDE
CONDUCTOR LAYER 324

IMAGE-CAPTURING-DEVICE-SIDE
CONDUCTOR LAYERS 323 AND 322

IMAGE-CAPTURING-DEVICE-SIDE
CONDUCTOR LAYER 321

COMPONENT-SIDE CONDUCTOR
LAYER 321

COMPONENT-SIDE CONDUCTOR
LAYERS 322 AND 323

COMPONENT-SIDE CONDUCTOR
LAYER 324

IMAGE-CAPTURING-DEVICE-SIDE CONDUCTOR LAYER 324

IMAGE-CAPTURING-DEVICE-SIDE CONDUCTOR LAYERS 323 AND 322

IMAGE-CAPTURING-DEVICE-SIDE CONDUCTOR LAYER 321

COMPONENT-SIDE CONDUCTOR LAYER 321

COMPONENT-SIDE CONDUCTOR LAYERS 322 AND 323

COMPONENT-SIDE CONDUCTOR LAYER 324

IMAGE CAPTURING DEVICE UNIT INCLUDING MULTILAYER SUBSTRATE, MULTILAYER SUBSTRATE, AND IMAGE CAPTURING APPARATUS

BACKGROUND OF THE INVENTION

Field of the Invention

The present invention relates to image capturing device units, multilayer substrates, and image capturing apparatuses, and more particularly to a wiring structure in a multilayer substrate, on which an image capturing device is to be mounted in an image capturing device unit.

Description of the Related Art

Many of conventional image capturing device units have a structure in which an image capturing component is mounted on a printed circuit board together with peripheral circuit components, where the image capturing component is a component such that an image capturing device is mounted in a hollow package formed of ceramic or plastic and the package is sealed by a cover glass. In recent years, there is a strong demand for reducing size and weight of image capturing device units, and Japanese Laid-Open Patent Publication (kokai) No. 2015-12211 proposes, as a technique for satisfying the demand, a so-called packageless structure such that an image capturing device is directly mounted on a printed circuit board formed of a glass epoxy or the like.

However, printed circuit boards having the packageless structure have the following problem. In such a printed circuit board, light passes through a region in which no conductor is arranged in order to insulate between signal wiring parts, resulting in that the image capturing device captures light that has entered the image capturing device from its back side. A need for preventing light from entering the image capturing devices from the back side is increasing with the increase in sensitivity of image capturing devices.

SUMMARY OF THE INVENTION

In view of such circumstances, the present invention provides image capturing device units having a packageless structure capable of preventing light from entering an image capturing device from its back side.

According to an embodiment of the present invention, an image capturing device unit comprises: a multilayer substrate; an image capturing device mounted on one face of the multilayer substrate; and a plurality of components mounted on the other face of the multilayer substrate. The multilayer substrate comprises: a plurality of electrodes on a surface of the multilayer substrate to electrically connect the image capturing device and the multilayer substrate; and a plurality of vias that electrically connect the plurality of electrodes and the plurality of components. The multilayer substrate further comprises: first wiring electrically connected to the plurality of vias; second wiring on a plurality of layers of the multilayer substrate; and a non-wired region that insulates the plurality of vias and the first wiring from the second wiring on each of the plurality of layers. The plurality of vias is located in the multilayer substrate so that, on a projection plane given when the multilayer substrate is viewed in a layering direction of the multilayer substrate, there is no area in which the non-wired region overlaps with a region where the image capturing device is arranged throughout the plurality of layers.

According to another embodiment of the present invention, an image capturing device unit comprises: a multilayer substrate; an image capturing device mounted on one face of the multilayer substrate; and a plurality of components mounted on the other face of the multilayer substrate. The multilayer substrate comprises: a plurality of electrodes on a surface of the multilayer substrate to electrically connect the image capturing device and the multilayer substrate; and a plurality of vias that electrically connect the plurality of electrodes and the plurality of components. The multilayer substrate further comprises: first wiring electrically connected to the plurality of vias; second wiring on a plurality of layers of the multilayer substrate; and a non-wired region that insulates the plurality of vias and the first wiring from the second wiring on each of the plurality of layers. The plurality of components and/or solder used for mounting the plurality of components on the multilayer substrate are located on the multilayer substrate to cover a predetermined area of a projection plane given when the multilayer substrate is viewed in a layering direction of the multilayer substrate, where the predetermined area is an area in which the non-wired regions of all of the plurality of layers overlap together.

According to another embodiment of the present invention, an image capturing apparatus comprises one of the above-described image capturing device units.

According to another embodiment of the present invention, a multilayer substrate comprises: a plurality of insulation layers; and a plurality of conductor layers each located between one and another of the plurality of insulation layers. The multilayer substrate further comprises: a plurality of electrodes on each of one face and the other face of the multilayer substrate; and a plurality of vias that electrically connects the plurality of electrodes on the one face and the plurality of electrodes on the other face. The plurality of conductor layers comprises: first wiring electrically connected to the plurality of vias; and second wiring insulated from the plurality of vias and the first wiring with a non-wired region. On a projection plane given when the multilayer substrate is viewed in a layering direction of the multilayer substrate, there is no area in which the non-wired region overlaps with a region where an image capturing device is to be arranged on the multilayer substrate throughout the plurality of layers.

According to the present invention, it is possible to provide image capturing device units having a packageless structure capable of preventing light from entering image capturing devices from the back side.

Further features of the present invention will become apparent from the following description of exemplary embodiments with reference to the attached drawings.

DESCRIPTION OF THE EMBODIMENTS

The present invention will now be described in detail below with reference to the accompanying drawings showing embodiments thereof.

Figure 1:
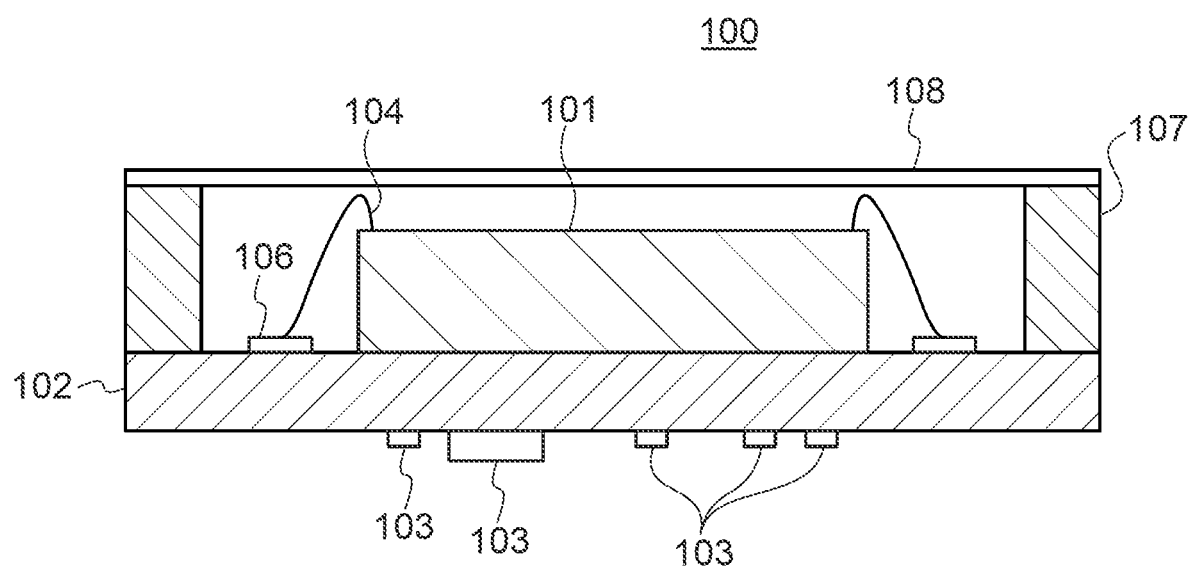
FIG. 1 is a cross-sectional view illustrating a schematic structure of an image capturing device unit according to an embodiment of the present invention.

FIG. 1 is a cross-sectional view illustrating a schematic structure of an image capturing device unit 100 according to embodiments of the present invention. The image capturing image capturing device unit 100 is used to be mounted on various kinds of electronic device including image capturing apparatuses such as digital cameras and digital video cameras, and smartphones having an imaging function.

The image capturing device unit 100 includes an image capturing device 101, a multilayer substrate 102, components 103, connection conductors 104, wire bonding pads 106, a frame member 107, and a cover glass 108.

The image capturing device 101 outputs an image signal according to incident light. The multilayer substrate 102 has a wiring (conductor) pattern formed of metal such as copper, for mounting various components 103 on the multilayer substrate 102 and connecting the various components 103 to the multilayer substrate 102. The image capturing device 101 is attached to one face (a surface) of the multilayer substrate 102 with an adhesive. The multilayer substrate 102 is preferably a rigid substrate for mounting the image capturing device 101 on the substrate 102, and is formed of, for example, glass epoxy or the like, but the material of the multilayer substrate 102 is not limited to this. The multilayer substrate 102 may be a flexible substrate made of a plastic material. The multilayer substrate 102 may be a low temperature co-fired ceramics (LTCC) substrate or the like prepared by using ceramic and copper wiring. That is, the multilayer substrate 102 may be any substrate as far as a wiring pattern formed of metal such as copper is a specific material is formed on the multilayer substrate 102 and the components 103 can be mounted on the multilayer substrate 102.

The components 103 are mounted on the other face of the multilayer substrate 102 (the back face or the face opposite to the face on which the image capturing device 101 is mounted). Specifically, the components 103 include passive components such as capacitors, resistors, and coils required for activating the image capturing device 101, a linear regulator that generates a drive voltage of the image capturing device 101, an oscillator that gives a clock, and the like. The components 103 may further include a component for the purpose other than activating the image capturing device 101, examples of which include a thermometer for monitoring the state of the image capturing device 101, and a ROM for storing individual information of the image capturing device 101. Further, the components 103 also include a connector in which a power supply terminal for receiving power supply from an external substrate (which is not illustrated) and a signal terminal for exchanging signals between the multilayer substrate 102 and the external substrate are gathered.

The wire bonding pads 106 are arranged on the same surface as the image capturing device 101 on the multilayer substrate 102, and are metal parts for electrically connecting the image capturing device 101 and the multilayer substrate 102. Specifically, the wire bonding pads 106 are electrodes formed by performing gold plating on the outermost layer of the multilayer substrate 102. The connection conductors 104 are metal wires that electrically connect the image capturing device 101 and the multilayer substrate 102 (or the wire bonding pads 106), and gold wires, aluminum wires, copper wires, or the like are mostly used for the connection conductors 104. The connection conductors 104 are connected to the image capturing device 101 and the wire bonding pads 106 typically by ultrasonic thermocompression bonding using a known wire bonder. The frame member 107 is set upright on the multilayer substrate 102 with an adhesive, while surrounding the wire bonding pads 106. The cover glass 108 is attached to the top of the frame member 107 so as to seal the image capturing device 101 into the frame member 107 and the cover glass 108. An antireflection film or the like is formed on the cover glass 108.

Figure 2A:
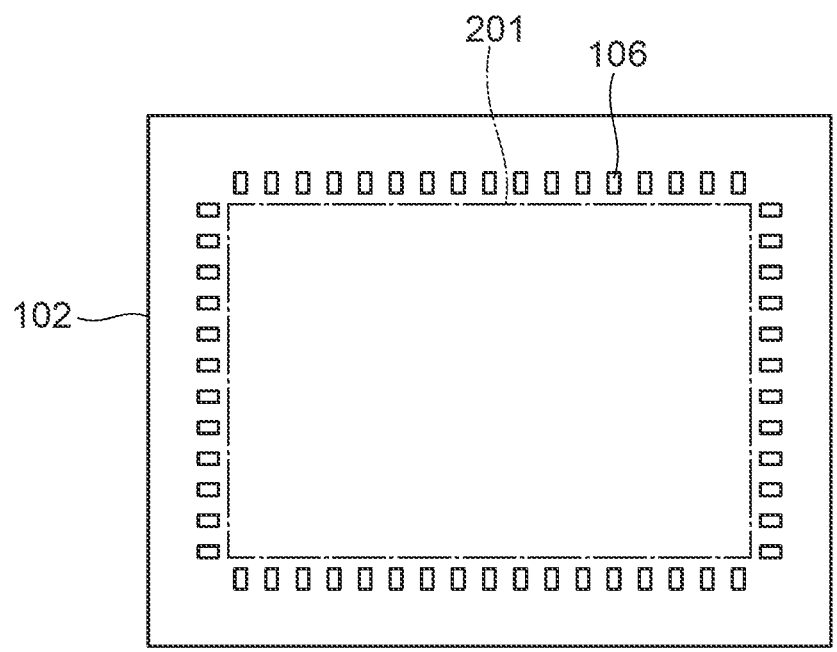
FIGS. 2A and 2B are views illustrating a layout of a multilayer substrate which is a component of the image capturing device unit of FIG. 1.
Figure 2B:
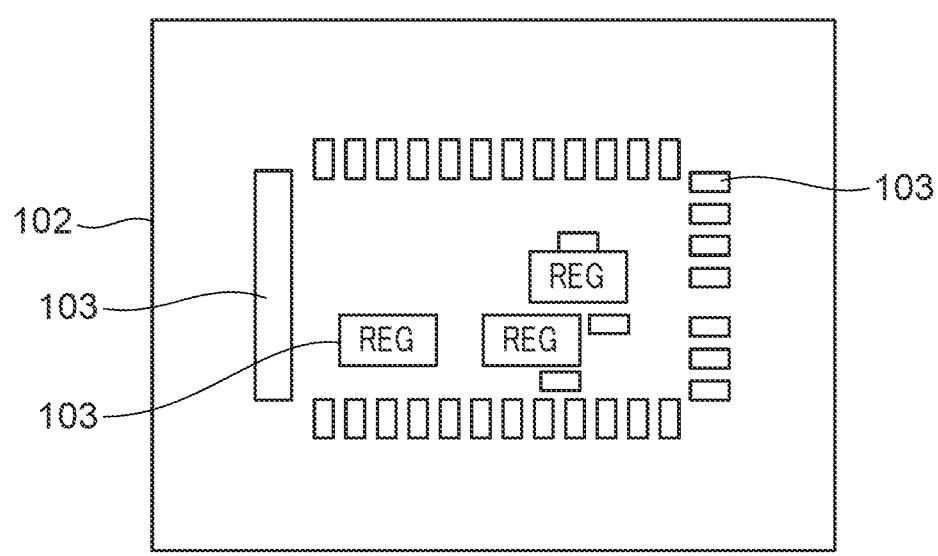

Next, a description is given of the layout of the multilayer substrate 102. FIG. 2A is a view illustrating the layout of a face of the multilayer substrate 102 on which the image capturing device 101 is mounted (hereinafter, defined as "the top face of the multilayer substrate 102"). FIG. 2B is a view illustrating the layout of another face of the multilayer substrate 102 on which the components 103 are mounted (hereinafter, defined as "the bottom face of the multilayer substrate 102").

A region 201 illustrated in FIG. 2A is a region where the image capturing device 101 is arranged, on a projection plane given when the multilayer substrate 102 is viewed in its layering direction (thickness direction). A plurality of the wire bonding pads 106 is arranged around the image capturing device 101. On the bottom face of the multilayer substrate 102, the components 103 including the passive components, the linear regulator, the clock, the oscillator, and the connector are mounted.

Figure 3:
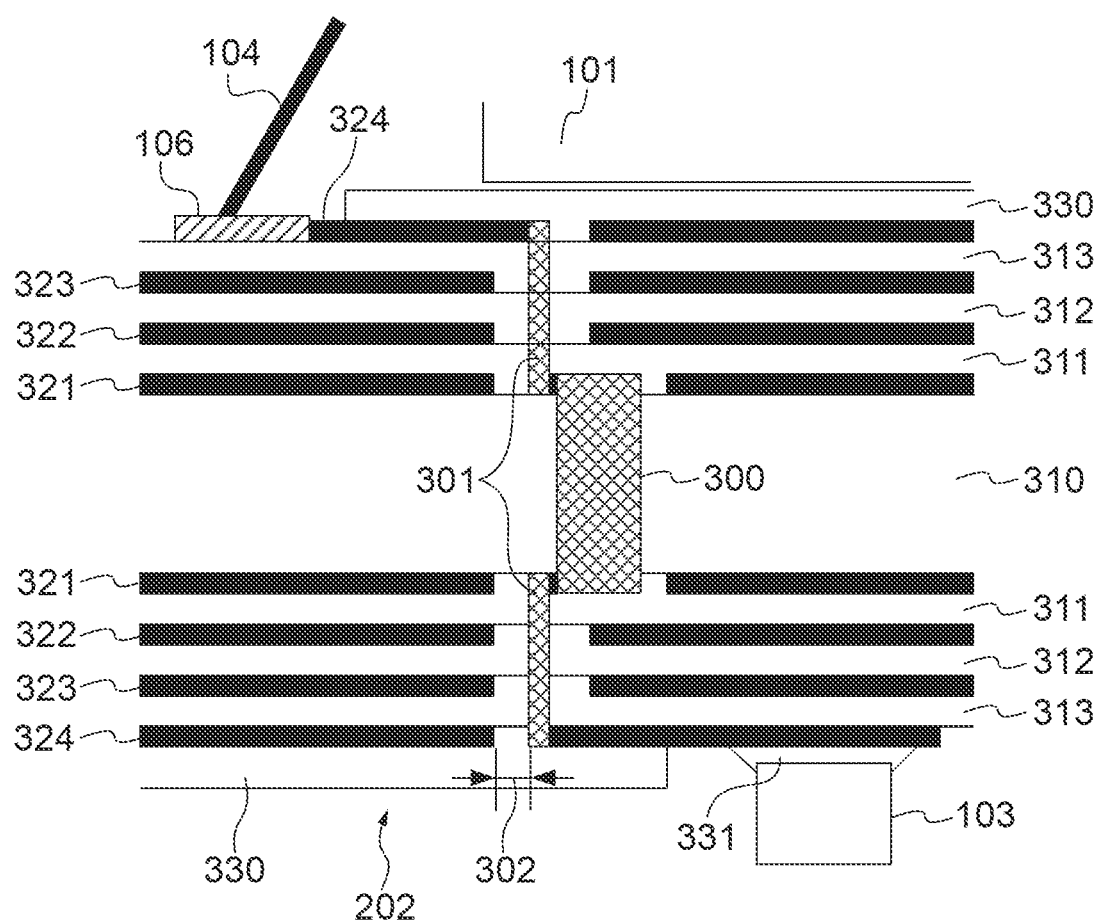
FIG. 3 is a partial cross-sectional view of an image capturing device unit including a multilayer substrate according to a reference example.

Before a description is given of the structure of the image capturing device unit 100 according to a first embodiment in detail, a description is given of the structure of the multilayer substrate as a reference example (a comparative example) with reference to FIG. 3, and FIGS. 4A to 4G. FIG. 3 is a partial cross-sectional view of an image capturing device unit including a multilayer substrate 202 according to the reference example. Since the image capturing device unit according to the reference example of FIG. 3 is different from the image capturing device unit 100 only in the structure of the multilayer substrate, constituents of the image capturing device unit according to the reference example are each denoted by the same name and reference numeral as those of constituents of the image capturing device unit 100.

The multilayer substrate 202 is a multilayer build-up substrate. The multilayer build-up substrate is a double-sided substrate in which conductor layers 321 are provided on opposite sides of an insulation layer 310 formed of prepreg that is a core. In FIG. 3, for the purpose of clarifying the structure of each part, hatchings indicating each insulation layer including the insulation layer 310 are omitted.

The conductor layers 321 on the opposite sides (the top and bottom faces) of the insulation layer 310 are patterned into a desired pattern by lithography and then connected by a via 300 which is a drill via. A non-wired region 302 in which a conductor layer 321 is not arranged is located in a region in which insulation is required between the via 300 and the conductor layer 321. An insulation layer 311 and a conductor layer 322 are arranged in this order on each of the top face and the bottom face of the double-sided substrate. The conductor layers 322 are also patterned into a desired pattern by lithography similarly to the conductor layers 321. At that time, the conductor layers 322 are each connected to the corresponding conductor layer 321 by the via 301 which is a laser via at a position in which connection is required, and a non-wired region 302 is provided in a region in which insulation from the via 301 is required.

Similarly, insulation layers 312 and conductor layers 323, and insulation layers 313 and conductor layers 324 are formed, and a structure in which the conductor layers are each located between one and another of the plurality of the insulation layers is formed. The insulation layers 311, the insulation layers 312, and the insulation layers 313 are also formed of prepreg like the insulation layers 310. The thickness of each of the insulation layers 310 is about 0.05 mm to 1.5 mm, and the thickness of each of the insulation layers 311, the insulation layers 312 and the insulation layers 313 is about 0.05 mm to 0.3 mm.

The prepreg is made by impregnating a fiber, which is weaved or knit on a cloth, with a resin, where a resin includes epoxy or phenol as the chief ingredient is widely used as the resin and the resin contains insulation filler made of paper, glass or the like in many cases. The fiber used for the prepreg is generally a glass fiber, but the fiber is not limited to this. Any kinds of fiber may be used for the prepreg as far as the fiber has insulation properties. In most cases, copper is preferably used for the conductor layers 321, the conductor layers 322, the conductor layers 323, and the conductor layers 324, but the material of these conductor layers is not limited to the copper. Other metals may be used for the conductor layers if necessary. Further, the multilayer substrate 202 is not limited to the multilayer build-up substrate. For example, a substrate (any layer substrate) which includes the insulation layer 310 with the same thickness as that of the insulation layers 311, the insulation layers 312, and the insulation layers 313 and does not use a drill via, may be used.

The wire bonding pads 106 are formed so as to be connected to the conductor layer 324 on the top face side (the image capturing device 101 side) of the multilayer substrate 202. Further, a solder resist film 330 is formed on the surfaces of the conductor layer 324 on the top face side and the bottom face side (the component 103 side) of the multilayer substrate 202. However, the solder resist film 330 is open at the position of a terminal or terminals for mounting the components 103 and the position where the wire bonding pads 106 are arranged. The components 103 are connected to the conductor layer 324 on the component 103 side with solder 331.

Figure 4A:
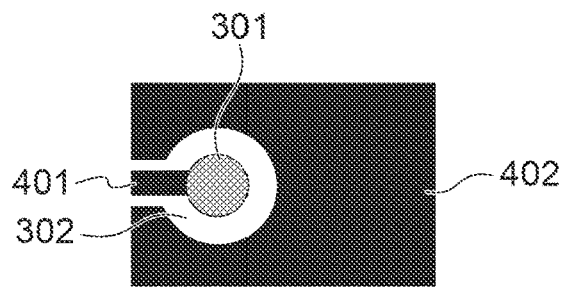
FIGS. 4A to 4G are views illustrating wiring in each layer of the multilayer substrate illustrated in FIG. 3.

FIGS. 4A to 4G are views illustrating a relationship between layers of the multilayer substrate 202, and the vias 300 and 301. FIG. 4A is a plan view illustrating the arrangement of the conductor layer 324 on the image capturing device 101 side (image-capturing-device-side conductor layer 324). Wiring 401 illustrated in FIG. 4A is signal wiring which is a part of the conductor layer 324, and connects the via 301 and the wire bonding pads 106 (which are not illustrated in the figure) connected to the image capturing device 101. Wiring 402 is signal wiring which is another part of the conductor layer 324 and different from the wiring 401, where example of the wiring 402 include GND wiring. The wiring 401 and the via 301 are insulated from the wiring 402 with the non-wired region 302 in which the conductor layer 324 is not formed.

Figure 4B:
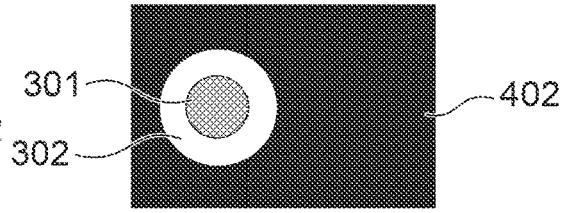
Figure 4C:
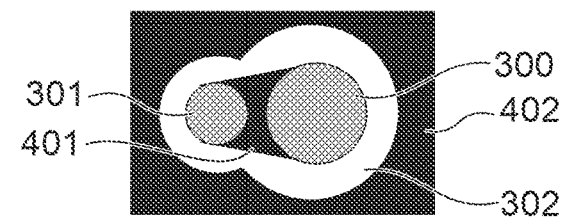

FIG. 4B is a plan view illustrating the arrangement of the conductor layers 323 and 322 on the image capturing device 101 side (image-capturing-device-side conductor layers 323 and 322). FIG. 4C is a plan view illustrating the arrangement of the conductor layer 321 on the image capturing device 101 side (image-capturing-device-side conductor layer 321). The structures of the conductor layers 323 and 322 are the same. A part of the via 301 electrically connected to the conductor layer 324 is conducted to other parts of the via 301 in the insulation layers 313, 312, and 311. In other words, the via 301 electrically connected to the conductor layer 324 extends to the surface of the insulation layer 310 on the image capturing device 101 side.

As illustrated in FIG. 4B, in each of the conductor layers 323 and 322, the via 301 is insulated from the wiring 402 in the conductor layer with the non-wired region 302. On the other hand, as illustrated in FIG. 4C, on the surface of the insulation layer 310 on the image capturing device 101 side, the via 301 is connected to the via 300 through the wiring 401 which is a part of the conductor layer 321. The wiring 401, the via 301, and the via 300 are insulated from the wiring 402 which is another part of the conductor layer 321 with the non-wired region 302.

Figure 4D:
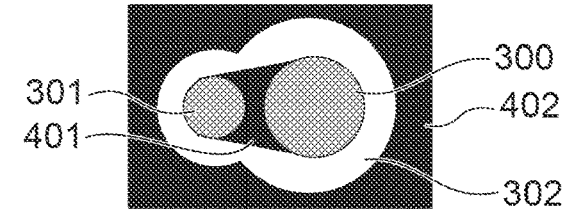

FIG. 4D is a plan view illustrating the arrangement of the conductor layer 321 on the component 103 side (component-side conductor layer 321). The arrangement of the conductor layer 321 on the component 103 side is the same as the arrangement of the conductor layer 321 on the image capturing device 101 side. That is, the via 300 penetrates the insulation layer 310 in the layering direction and is exposed to the surface on the component 103 side. On the component 103 side, the via 300 is connected to the via 301 through the wiring 401 which is a part of the conductor layer 321. The wiring 401, the via 300, and the via 301 are insulated from the wiring 402 which is another part of the conductor layer 321 with the non-wired region 302.

Figure 4E:
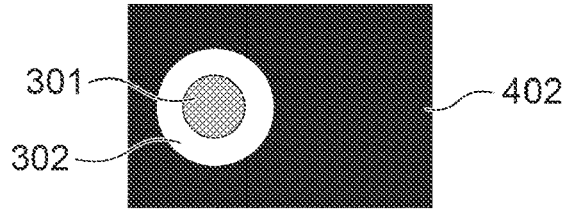
Figure 4F:
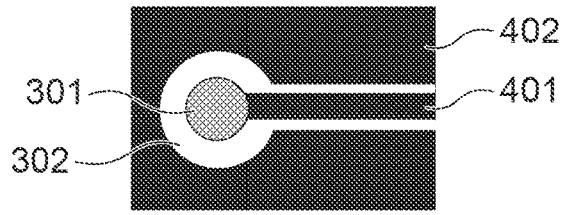

FIG. 4E is a plan view illustrating the arrangement of the conductor layers 323 and 322 on the component 103 side (component-side conductor layers 322 and 323). FIG. 4F is a plan view illustrating the arrangement of the conductor layer 324 on the component 103 side (component-side conductor layer 324). On the component 103 side, the part of the via 301 electrically connected to the via 300 is conducted to other parts of the via 301 in the insulation layers 311, 312, and 313. In other words, the via 301 electrically connected to the via 300 extends to the surface of the insulation layer 313 on the component 103 side.

The arrangement of the conductor layers 323 and 322 on the component 103 side is the same as the arrangement of the conductor layers 323 and 322 on the image capturing device 101 side. That is, in FIG. 4E, the via 301 is insulated from the wiring 402 in each of the conductor layers 322, and 323 with the non-wired region 302. On the other hand, in FIG. 4F, the wiring 401, which is a part of the signal wiring in the conductor layer 324, is connected to the via 301. Then, the wiring 401 and the via 301 are insulated from the wiring 402, which is another part of the conductor layer 324 and different from the wiring 401, with the non-wired region 302 in which the conductor layer 324 is not formed. The wiring 401 is connected to the component 103 by the solder 331. The wiring 402 in the conductor layers in FIGS. 4A to 4F is not necessarily the same node.

Figure 4G:
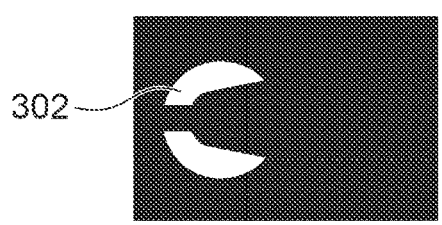

FIG. 4G is a view illustrating a state in which wiring patterns of the conductor layers 321 to 324 of FIGS. 4A to 4F are overlapped with each other in the layering direction. In the image capturing device unit according to the reference example, two vias 301 are located at the same position on a projection plane given when the multilayer substrate 202 is viewed in the layering direction, which makes a non-wired region 302 having no conductor in the region 201. This non-wired region 302 is composed only of the prepreg of the insulation layer and the solder resist film 330. As described above, the prepreg does not have light-shielding properties since the fiber is impregnated with the resin, and the solder resist film 330 also does not have the light-shielding properties. Therefore, in the multilayer substrate 202, light enters the image capturing device 101 from the back side through the non-wired region 302.

The structure of the multilayer substrate 102 according to the first embodiment for solving this problem will be described with reference to FIGS. 5A to 5G, and FIGS. 6A to 6G. Since the multilayer substrate 102 is different from the multilayer substrate 202 described above only in the wiring patterns of the conductor layers and the positions of the vias, the cross-sectional view corresponding to FIG. 3 will be omitted, and the description of schematic structure of the multilayer substrate 102, a material used in each layer, and a manufacturing method will be omitted. Each part constituting the multilayer substrate 102 will be described by using the same name and reference numeral as those of each part constituting the multilayer substrate 202.

Figure 5A:
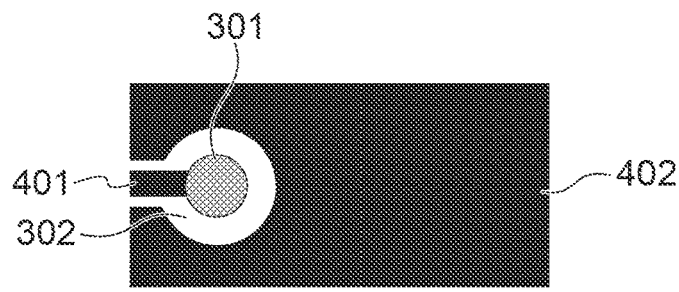
FIGS. 5A to 5G are views illustrating wiring in each layer of a first multilayer substrate in the first embodiment.
Figure 5B:
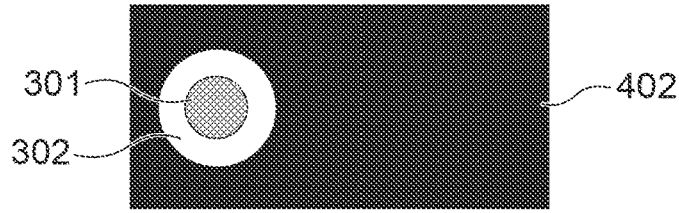
Figure 5C:
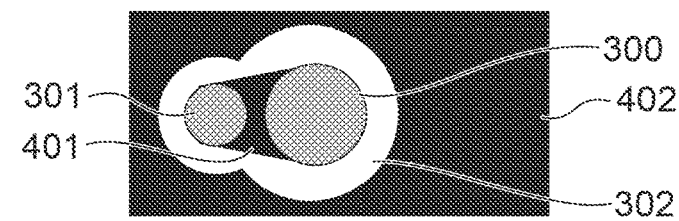
Figure 5D:
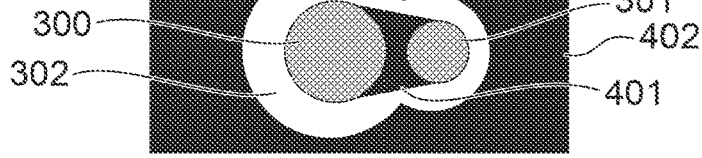

FIGS. 5A to 5G are views illustrating the structure of the multilayer substrate 102 of the first embodiment as in FIGS. 4A to 4G. Since FIGS. 5A to 5C are the same as FIGS. 4A to 4C, the description thereof will be omitted. FIG. 5D is a plan view illustrating the arrangement of the conductor layer 321 on the component 103 side (component-side conductor layer 321). The via 301 on the component 103 side is located at a position different from the via 301 on the image capturing device 101 side on the projection plane given when the multilayer substrate 102 is viewed in the layering direction. In this case, the vias 301 are located a fixed distance away from each other so that the non-wired region 302 around the via 301 on the image capturing device 101 side of FIGS. 5A to 5C, and the non-wired region 302 around the via 301 on the component 103 side of FIG. 5D do not overlap each other.

Figure 5E:
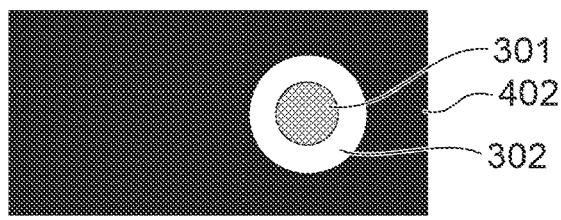
Figure 5F:
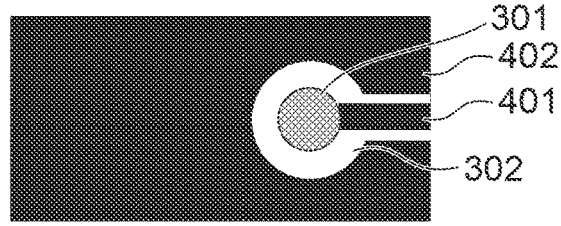
Figure 5G:
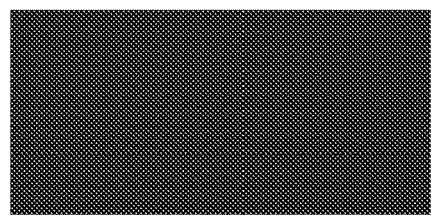

The wiring patterns of the wirings 401 and 402 in FIGS. 5E and 5F are different from those in FIGS. 4E and 4F since the position of the via 301 on the component 103 side is different, but states of the conduction and insulation of each part is the same. Therefore, detailed description will be omitted. FIG. 5G is a view illustrating a state in which wiring patterns of the conductor layers 321 to 324 of FIGS. 5A to 5F are overlapped in the layering direction. As illustrated in FIG. 5G, in the image capturing device unit 100, it can be seen that there is no area in which the non-wired region 302 overlaps with the region 201 throughout the layers, on the projection plane given when the multilayer substrate 102 is viewed in the layering direction. That is, it can be seen that a light-shielding structure that prevents light from entering the image capturing device 101 from the back side is achieved.

In the first embodiment of the multilayer substrate 102 of FIGS. 5A to 5G, the light-shielding structure on the back side of the image capturing device 101 is achieved by devising the arrangement of the vias 301, but in the second embodiment of the multilayer substrate 102, the light-shielding structure on the back surface side of the image capturing device 101 is achieved by devising the pattern of the wiring 401.

Figure 6A:
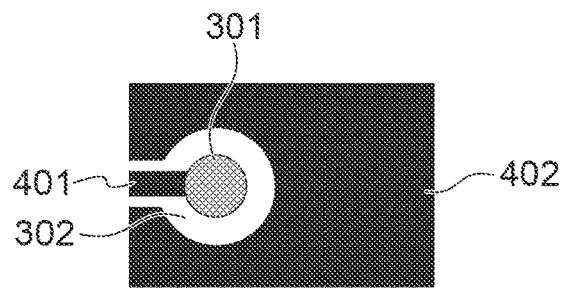
FIGS. 6A to 6G are views illustrating wiring in each layer of a second multilayer substrate in the first embodiment.
Figure 6B:
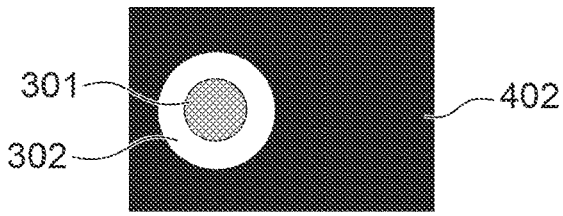
Figure 6C:
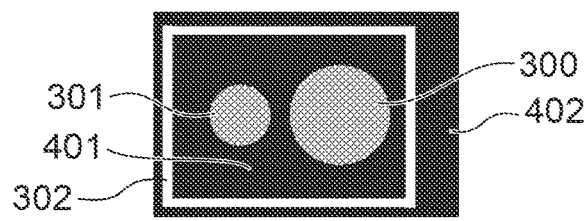
Figure 6D:
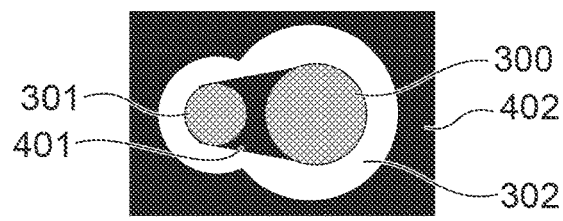
Figure 6E:
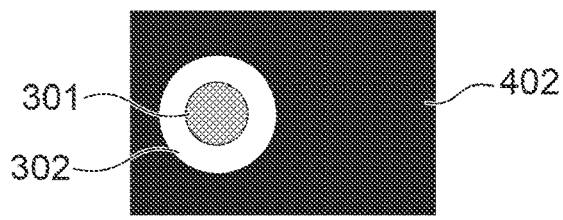
Figure 6F:
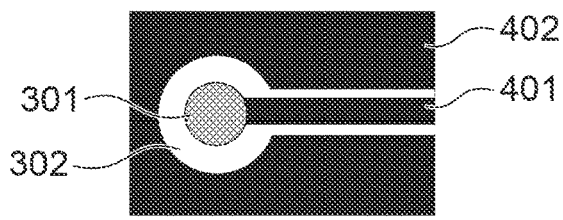
Figure 6G:
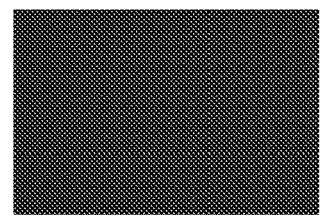

FIGS. 6A to 6G are views illustrating the structure of the multilayer substrate 102 of the second embodiment as in FIGS. 4A to 4G. Since FIGS. 6A, 6B, and 6D to 6F are the same as FIGS. 4A, 4B, and 4D to 4F, the description thereof will be omitted. FIG. 6C is a plan view illustrating the arrangement of the conductor layer 321 on the image capturing device 101 side (image-capturing-device-side conductor layer 321). The arrangement of the wiring 401 and the non-wired region 302 in FIG. 6C is different from the arrangement of the wiring 401 and the non-wired region 302 in FIG. 4C. In FIG. 6C, the wiring 401 is located so as to surround the vias 300 and 301, and to be electrically connected to the vias 300 and 301. The vias 300 and 301, and the wiring 401 are insulated from the wiring 402 by providing the non-wired region 302 so as to surround the wiring 401.

In the second embodiment of the multilayer substrate 102, by structing as described above, there is no area in which the non-wired region 302 including no conductor overlaps with the region 201 throughout the layers, on the projection plane given when the multilayer substrate 102 is viewed in the layering direction. Thereby, the light-shielding structure that prevents light from entering the image capturing device 101 from the back side is achieved. The same effect can be obtained by applying the wiring pattern of FIG. 4C to FIG. 6C and applying the wiring pattern of FIG. 6C to FIG. 6D.

As described above, in the image capturing device unit 100 having the packageless structure according to the first embodiment, the multilayer substrate 102 includes a light-shielding structure that can prevent light from entering the image capturing device 101 from the back side. For example, in the image capturing apparatus using the image capturing device unit including the multilayer substrate 202 illustrated in FIG. 3 and FIGS. 4A to 4G, it is necessary to provide a light-shielding member in the image capturing apparatus to achieve a light-shielding structure for the image capturing device 101. On the other hand, the image capturing apparatus equipped with the image capturing device unit 100 according to the first embodiment does not require a separate light-shielding member, and thus it is possible to avoid an increase in cost and weight.

In the first embodiment described above, the light-shielding structure for preventing light from entering the image capturing device 101 from the back side is achieved by devising the vias 301, and the wirings 401 and 402 of the multilayer substrate 102. On the other hand, in the second embodiment, the light-shielding structure is achieved by using the components 103 mounted on the multilayer substrate 102.

Figure 7:
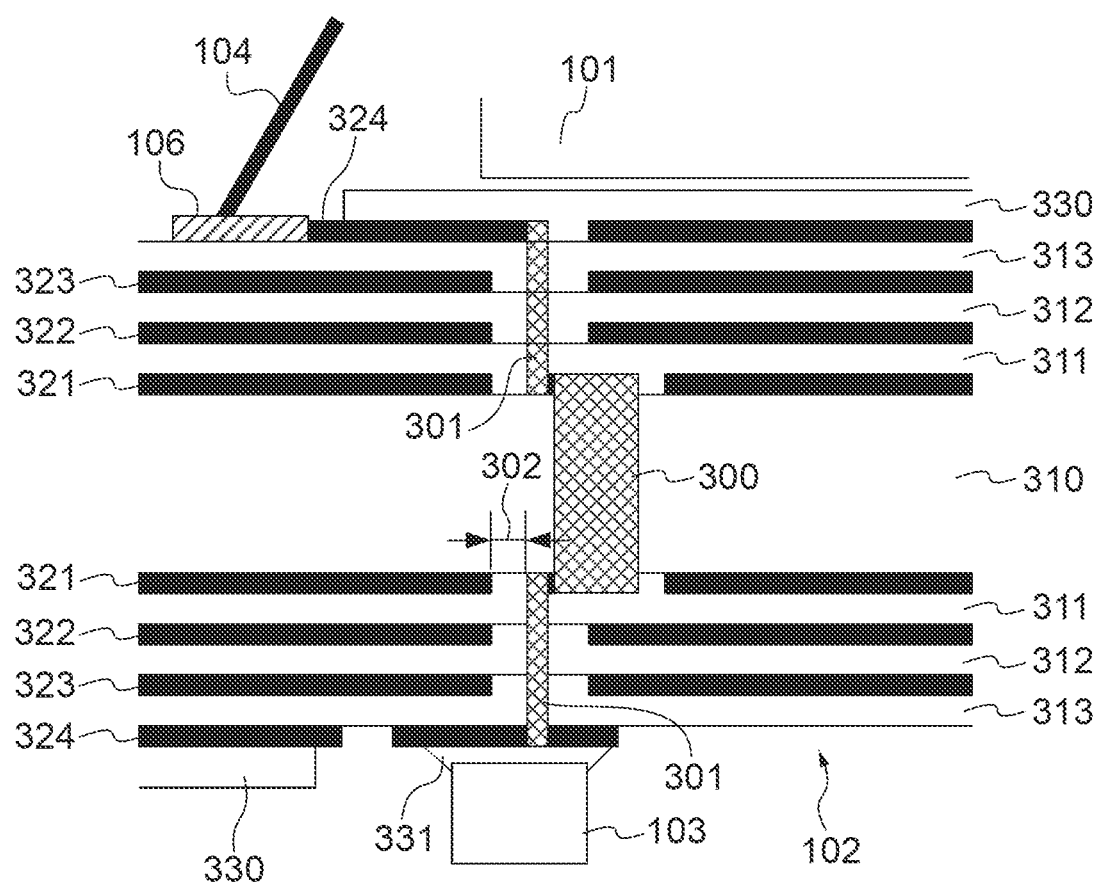
FIG. 7 is a partial cross-sectional view of an image capturing device unit according to the second embodiment.

FIG. 7 is a partial cross-sectional view of the image capturing device unit according to a second embodiment. Since the overall structure of the image capturing device unit according to the second embodiment is equivalent to the overall structure (FIG. 1) of the image capturing device unit 100 according to the first embodiment, illustration and description will be omitted. In the image capturing device unit according to the second embodiment, the light-shielding structure that prevents light from entering the image capturing device 101 from the back side is achieved by adjusting the mounting position of the components 103 and the wiring pattern of the conductor layer 324 on the component 103 side in the image capturing device unit according to the reference examples illustrated in FIG. 3 and FIGS. 4A to 4G. Therefore, the constituents of the image capturing device unit according to the second embodiment will be described by using the same name and reference numeral as those of constituents of the image capturing device unit according to the reference example described with reference to FIG. 3 and FIGS. 4A to 4G. Further, only the difference from the image capturing device unit according to the reference example will be described, and the description of the same structure will be omitted.

In the image capturing device unit according to the second embodiment, the components 103 are located so as to cover the non-wired region 302 of the conductor layer 323 on the component 103 side on the projection plane given when the multilayer substrate 102 is viewed in the layering direction. Accordingly, the wiring pattern of the conductor layer 324 on the component 103 side, the vias 301, and the component 103 can shield the non-wired region 302 in each of the other conductor layers from light, and the details thereof will be described with reference to FIGS. 8A to 8G.

Figure 8A:
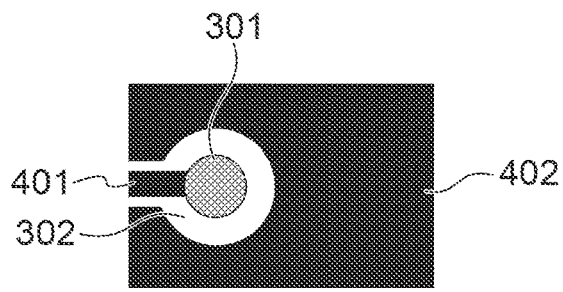
FIGS. 8A to 8G are views illustrating wiring in each layer of the multilayer substrate illustrated in FIG. 7.
Figure 8B:
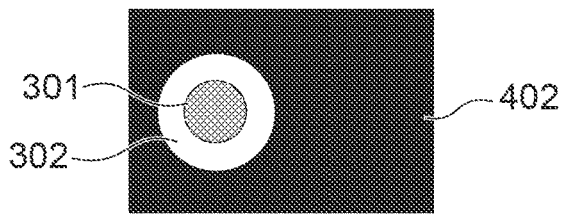
Figure 8C:
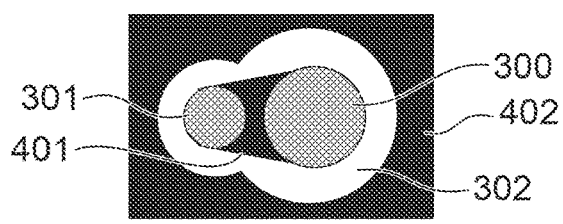
Figure 8D:
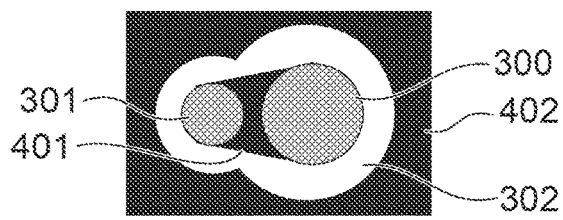
Figure 8E:
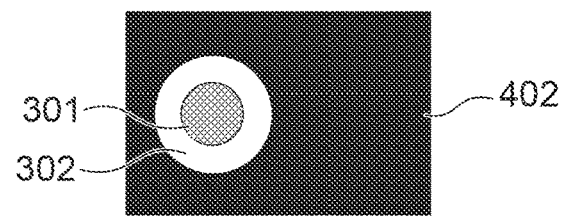
Figure 8F:
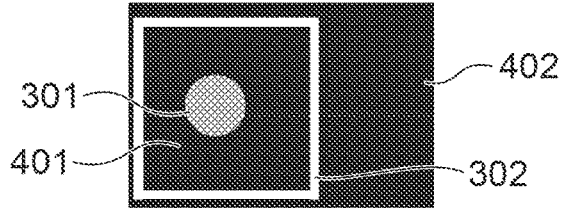

FIGS. 8A to 8G are views illustrating the structure of the multilayer substrate 102 used in the image capturing device unit according to the second embodiment as in FIGS. 4A to 4G. Since FIGS. 8A to 8E are the same as FIGS. 4A to 4E, the description thereof will be omitted. In FIG. 8F, the wiring 401 is located so as to enclose the non-wired region 302 surrounding the via 301 in FIG. 8E, that is, in FIG. 8F, the wiring 401 is located so that the outer periphery of the via 301 is surrounded by the wiring 401 which is a part of the conductor layer 324, and the wiring 401 and via 301 are connected with each other. Then, the non-wired region 302 is located so that the wiring 401 and the via 301 are insulated from the wiring 402 which is another part of the conductor layer 324.

Figure 8G:
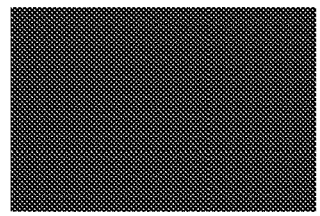

Here, the non-wired region 302 of FIG. 8F is provided so as not to overlap with the non-wired region 302 of FIG. 8E. The solder 331 is piled up on the wiring 401 of FIG. 8F, and the component 103 is mounted on the solder 331. As a result, as illustrated in FIG. 8G indicating a state in which the wiring patterns of the conductor layers 321 to 324 of FIGS. 8A to 8F overlap each other in the layering direction, the non-wired region 302 in which the conductor does not exist can be removed from the region 201 (the region in which the image capturing device 101 is mounted) on the projection plane given when the multilayer substrate 102 is viewed in the layering direction. The non-wired region 302 of FIG. 8E may be shielded from light only by the solder 331 and/or the component 103 without shielding the non-wired region 302 of FIG. 8E from light by the wiring 401 of the conductor layer 324 of FIG. 8F.

OTHER EMBODIMENTS

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-041717 filed on Mar. 11, 2020 which is hereby incorporated by reference herein in its entirety.

What is claimed is:

1. An image capturing device unit comprising:
a multilayer substrate;
an image capturing device mounted on one face of the multilayer substrate; and
a plurality of components mounted on the other face of the multilayer substrate,
wherein the multilayer substrate comprises:
a plurality of electrodes on a surface of the multilayer substrate to electrically connect the image capturing device and the multilayer substrate;
a plurality of vias that electrically connect the plurality of electrodes and the plurality of components;
first wiring electrically connected to the plurality of vias;
second wiring on a plurality of layers of the multilayer substrate; and
a non-wired region that insulates the plurality of vias and the first wiring from the second wiring on each of the plurality of layers, and
wherein the plurality of vias is located in the multilayer substrate so that, on a projection plane given when the multilayer substrate is viewed in a layering direction of the multilayer substrate, there is no area in which the non-wired region overlaps with a region where the image capturing device is arranged throughout the plurality of layers.

2. The image capturing device unit according to claim 1, wherein the plurality of vias is located away from each other.

3. The image capturing device unit according to claim 1, wherein the first wiring includes wiring connected to the plurality of vias with surrounding the plurality of vias and being surrounded by the non-wired region.

4. The image capturing device unit according to claim 1, wherein the multilayer substrate comprises:
a plurality of insulation layers, and
a plurality of conductor layers each located between one and another of the plurality of insulation layers, including the first wiring, the second wiring, or both the first wiring and the second wiring, and
the plurality of insulation layers does not have light-shielding properties.

5. An image capturing apparatus comprising an image capturing device unit, the image capturing device unit comprising:
a multilayer substrate;
an image capturing device mounted on one face of the multilayer substrate; and
a plurality of components mounted on the other face of the multilayer substrate,
wherein the multilayer substrate comprises:
a plurality of electrodes on a surface of the multilayer substrate to electrically connect the image capturing device and the multilayer substrate;
a plurality of vias that electrically connect the plurality of electrodes and the plurality of components;
first wiring electrically connected to the plurality of vias;
second wiring on a plurality of layers of the multilayer substrate; and
a non-wired region that insulates the plurality of vias and the first wiring from the second wiring on each of the plurality of layers, and
wherein the plurality of vias is located in the multilayer substrate so that, on a projection plane given when the multilayer substrate is viewed in a layering direction of the multilayer substrate, there is no area in which the non-wired region overlaps with a region where the image capturing device is arranged throughout the plurality of layers.

6. An image capturing device unit comprising:
a multilayer substrate;
an image capturing device mounted on one face of the multilayer substrate; and
a plurality of components mounted on the other face of the multilayer substrate,
wherein the multilayer substrate comprises:
a plurality of electrodes on a surface of the multilayer substrate to electrically connect the image capturing device and the multilayer substrate;

a plurality of vias that electrically connect the plurality of electrodes and the plurality of components;

first wiring electrically connected to the plurality of vias;

second wiring on a plurality of layers of the multilayer substrate; and a non-wired region that insulates the plurality of vias and the first wiring from the second wiring on each of the plurality of layers, and wherein the plurality of components, solder, or the plurality of components and solder used for mounting the plurality of components on the multilayer substrate are located on the multilayer substrate to cover a predetermined area of a projection plane given when the multilayer substrate is viewed in a layering direction of the multilayer substrate, the predetermined area being an area in which the non-wired regions of all of the plurality of layers overlap together.

7. The image capturing device unit according to claim 6, wherein the multilayer substrate comprises:

a plurality of insulation layers, and a plurality of conductor layers each located between one and another of the plurality of insulation layers, including the first wiring, the second wiring, or the first wiring and the second wiring, and the plurality of insulation layers does not have light-shielding properties.

8. An image capturing apparatus comprising an image capturing device unit, the image capturing device unit comprising:

a multilayer substrate;

an image capturing device mounted on one face of the multilayer substrate; and a plurality of components mounted on the other face of the multilayer substrate, wherein the multilayer substrate comprises:

a plurality of electrodes on a surface of the multilayer substrate to electrically connect the image capturing device and the multilayer substrate;

a plurality of vias that electrically connect the plurality of electrodes and the plurality of components;

first wiring electrically connected to the plurality of vias;

second wiring on a plurality of layers of the multilayer substrate; and a non-wired region that insulates the plurality of vias and the first wiring from the second wiring on each of the plurality of layers, and wherein the plurality of components, solder, or the plurality of components and solder used for mounting the plurality of components on the multilayer substrate are located on the multilayer substrate to cover a predetermined area of a projection plane given when the multilayer substrate is viewed in a layering direction of the multilayer substrate, the predetermined area being an area in which the non-wired regions of all of the plurality of layers overlap together.

9. A multilayer substrate comprising:

a plurality of insulation layers;

a plurality of conductor layers each located between one and another of the plurality of insulation layers;

a plurality of electrodes on each of one face and the other face of the multilayer substrate; and a plurality of vias that electrically connects the plurality of electrodes on the one face and the plurality of electrodes on the other face, wherein the plurality of conductor layers comprises:

first wiring electrically connected to the plurality of vias; and second wiring insulated from the plurality of vias and the first wiring with a non-wired region, and wherein on a projection plane given when the multilayer substrate is viewed in a layering direction of the multilayer substrate, there is no area in which the non-wired region overlaps with a region where an image capturing device is to be arranged on the multilayer substrate throughout the plurality of layers.

\* \* \* \* \*